US011177454B2

(12) United States Patent
Choi

(10) Patent No.: US 11,177,454 B2
(45) Date of Patent: *Nov. 16, 2021

(54) DISPLAY APPARATUS

(71) Applicant: Samsung Display Co., Ltd., Yongin-Si (KR)

(72) Inventor: Beomgyu Choi, Seoul (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/798,251

(22) Filed: Feb. 21, 2020

(65) Prior Publication Data

US 2020/0194709 A1 Jun. 18, 2020

Related U.S. Application Data

(63) Continuation of application No. 15/604,450, filed on May 24, 2017, now Pat. No. 10,600,988.

(30) Foreign Application Priority Data

Jul. 19, 2016 (KR) .................. 10-2016-0091560

(51) Int. Cl.
*H01L 51/52* (2006.01)
*B32B 3/02* (2006.01)
(Continued)

(52) U.S. Cl.
CPC ............. *H01L 51/524* (2013.01); *B32B 3/02* (2013.01); *B32B 3/26* (2013.01); *B32B 17/06* (2013.01);
(Continued)

(58) Field of Classification Search
CPC ............... H01L 51/524; H01L 51/0097; H01L 27/3244; H01L 2251/5323;
(Continued)

(56) References Cited

U.S. PATENT DOCUMENTS 8,005,518 B1   8/2011  Birsel et al.
8,228,667 B2   7/2012  Ma
(Continued)

FOREIGN PATENT DOCUMENTS

CN   102855822 A   1/2013
CN   103078974 A   5/2013
(Continued)

OTHER PUBLICATIONS

Chinese Office Action Report, Application No. 201710584440.X dated Aug. 28, 2020, 8 pages.
(Continued)

*Primary Examiner* — David Sample
*Assistant Examiner* — Donald M Flores, Jr.
(74) *Attorney, Agent, or Firm* — Innovation Counsel LLP

(57) ABSTRACT

Provided is a window of a display apparatus. The window includes a front surface part including first short sides extending in a first direction to face each other in a second direction crossing the first direction, first long sides extending in the second direction to face each other in the first direction, and first rounded portions respectively extending from both sides of the first long sides and respectively connected to both sides of the first short sides disposed adjacent to the first long sides, side surface parts respectively extending from the first long sides and bent in a third direction crossing a plane parallel to the first and second directions, and a rear surface part extending from one of the side surface parts to face the front surface part.

21 Claims, 10 Drawing Sheets

(51) Int. Cl.
*B32B 3/26* (2006.01)
*B32B 17/06* (2006.01)
*B32B 27/06* (2006.01)
*H01L 51/00* (2006.01)
*G02F 1/1333* (2006.01)
*G06F 1/16* (2006.01)
*G09F 9/30* (2006.01)
*H01L 27/32* (2006.01)
*H04M 1/02* (2006.01)

(52) U.S. Cl.
CPC ........ *B32B 27/06* (2013.01); *G02F 1/133308* (2013.01); *H01L 51/0097* (2013.01); *B32B 2457/20* (2013.01); *G02F 1/133305* (2013.01); *G06F 1/1616* (2013.01); *G06F 1/1637* (2013.01); *G09F 9/30* (2013.01); *G09F 9/301* (2013.01); *H01L 27/3244* (2013.01); *H01L 2251/5323* (2013.01); *H01L 2251/5338* (2013.01); *H04M 1/0216* (2013.01); *H04M 1/0268* (2013.01); *Y10S 345/905* (2013.01); *Y10T 428/24628* (2015.01)

(58) Field of Classification Search
CPC ....... H01L 2251/5338; G02F 1/133308; G02F 1/133305; B32B 3/02; B32B 3/26; B32B 17/06; B32B 27/06; B32B 2457/20; B32B 2457/206; B32B 2255/10; B32B 2255/20; B32B 2255/28; B32B 2307/412; B32B 27/36; B32B 27/365; B32B 27/281; B32B 27/308; B32B 2250/02; B32B 27/08; B32B 3/08; Y10T 428/24628; G06F 1/1616; G06F 1/1637; G09F 9/30; G09F 9/301; H04M 1/0216; H04M 1/0268; Y10S 345/905; Y02E 10/549
See application file for complete search history.

(56) References Cited

U.S. PATENT DOCUMENTS

| | | | |
|---|---|---|---|
| 8,665,236 B2 | 3/2014 | Myers | |
| 8,727,290 B1 | 5/2014 | De La Matta et al. | |
| 8,804,324 B2 | 8/2014 | Bohn et al. | |
| D747,301 S | 1/2016 | Lee et al. | |
| 9,250,651 B2 | 2/2016 | Cavallaro et al. | |
| 9,297,495 B2 | 3/2016 | Fischer et al. | |
| 9,614,940 B2 | 4/2017 | Huang et al. | |
| 9,690,329 B2 | 6/2017 | Jung et al. | |
| 9,697,764 B2 | 7/2017 | Kim et al. | |
| 9,701,562 B2 | 7/2017 | Wada et al. | |
| 9,838,518 B2 | 12/2017 | Lei et al. | |
| 10,061,356 B2 | 8/2018 | Jin et al. | |
| 10,095,271 B2 | 10/2018 | Wang et al. | |
| 10,129,989 B2 | 11/2018 | Kim et al. | |
| 10,600,988 B2 * | 3/2020 | Choi | H01L 51/524 |
| 2010/0294908 A1 | 11/2010 | Mish et al. | |
| 2011/0141390 A1 | 6/2011 | Lee et al. | |
| 2012/0075789 A1 | 3/2012 | DeCamp et al. | |
| 2012/0080577 A1 | 4/2012 | McIntyre et al. | |
| 2012/0234055 A1 | 9/2012 | Bland, III et al. | |
| 2012/0241567 A1 | 9/2012 | Gillespie-Brown et al. | |
| 2012/0273630 A1 | 11/2012 | Gillespie-Brown et al. | |
| 2013/0076612 A1 | 3/2013 | Myers | |
| 2014/0042285 A1 | 2/2014 | Carnevali | |
| 2014/0063719 A1 | 3/2014 | Yamazaki et al. | |
| 2014/0132481 A1 | 5/2014 | Bell et al. | |
| 2014/0370244 A1 | 12/2014 | Kinoshita | |
| 2015/0095826 A1 | 4/2015 | Ahn et al. | |
| 2015/0138041 A1 * | 5/2015 | Hirakata | H01L 51/0097 345/1.3 |
| 2015/0146069 A1 | 5/2015 | Yamazaki et al. | |
| 2016/0109852 A1 | 4/2016 | Kuwabara et al. | |
| 2016/0139629 A1 | 5/2016 | Yeo | |
| 2017/0273199 A1 | 9/2017 | Lee et al. | |
| 2017/0293194 A1 | 10/2017 | Hou et al. | |

FOREIGN PATENT DOCUMENTS

| | | |
|---|---|---|
| CN | 202918356 U | 5/2013 |
| CN | 202918357 U | 5/2013 |
| CN | 103810945 A | 5/2014 |
| CN | 103827770 A | 5/2014 |
| CN | 204180118 U | 2/2015 |
| CN | 104704545 A | 6/2015 |
| CN | 204406267 U | 6/2015 |
| CN | 105225610 A | 1/2016 |
| CN | 205179138 U | 4/2016 |
| KR | 10-2014-0001579 A | 1/2014 |
| KR | 10-2014-0054746 A | 5/2014 |
| KR | 10-2014-0137484 A | 12/2014 |
| KR | 10-2014-0148176 A | 12/2014 |
| KR | 10-2016-0027893 A | 3/2016 |
| KR | 1020170109139 A | 9/2017 |

OTHER PUBLICATIONS

Chinese Office Action Report, Application No. 201710584440.X dated May 17, 2021, 8 pages.

* cited by examiner

DISPLAY APPARATUS

CROSS-REFERENCE TO RELATED APPLICATIONS

This application is a continuation application of U.S. patent application Ser. No. 15/604,450 filed on May 24, 2017, which claims priority under 35 USC § 119 to Korean Patent Application No. 10-2016-0091560, filed on Jul. 19, 2016, the disclosures of which are incorporated herein in their entirety by reference.

BACKGROUND

The present disclosure herein relates to a display apparatus, and more particularly, to a display apparatus including a window suitable for four-surface or three-surface display.

Electronic equipment such as smart phones, digital cameras, laptop computers, navigation devices, and smart televisions generally includes a display apparatus for displaying an image to a user. The display apparatus includes a display panel for generating and displaying an image and a window disposed above the display panel to protect the display panel. The image generated from the display panel may pass through the window and then be provided to the user.

Various display panels such as liquid crystal display panels, organic light emitting display panels, electro wetting display panels, and electrophoretic display panels have been developing. Due to technology development of the display apparatus in recent years, a flexible display panel that is foldable or rollable has been developing. The flexible display panel includes a substrate made of a plastic material having flexibility and electronic elements disposed on the substrate.

The display apparatus capable of folding or rolling the above-described flexible display panel to provide various display surfaces to the user has been developing. Accordingly, the window that is foldable or rollable to have various shapes is required to be developed for protecting the flexible display panel.

SUMMARY

The present disclosure provides a display apparatus including a window suitable for four-surface or three-surface display.

An embodiment of the inventive concept provides a display apparatus including a display panel and a window disposed on the display panel. Here, the window includes: a front surface part including first short sides extending in a first direction to face each other in a second direction crossing the first direction, first long sides extending in the second direction to face each other in the first direction, and first rounded portions respectively extending from both sides of the first long sides and respectively connected to both sides of the first short sides disposed adjacent to the first long sides; side surface parts respectively extending from the first long sides and bent in a third direction crossing a plane parallel to the first and second directions; and a rear surface part extending from one of the side surface parts to face the front surface part.

In an embodiment, the display panel may be disposed in a space defined by the front surface part, the side surface parts, and the rear surface part.

In an embodiment, a first length defined as a length between the first short sides in the second direction may greater than a second length defined as a length between the side surface parts in the second direction, and a third length defined as a length between the first long sides in the first direction may be greater than a fourth length defined as a length of each of the first short sides in the first direction and less than the first length.

In an embodiment, each of the first rounded portions may have a convexly curved quarter-circular shape In an embodiment, the rear surface part may have the same shape as the front surface part and be bent from one of the side surface parts in the first direction to overlap the front surface part.

In an embodiment, the rear surface part may include: second short sides extending in the first direction to face each other in the second direction; second long sides extending in the second direction to face each other in the first direction; and second rounded portions respectively extending from both sides of each of the second long sides and respectively connected to both sides of each of the second short sides disposed adjacent to the second long sides. Here, each of the second rounded portions may have a convexly curved quarter-circular shape.

In an embodiment, the display panel may be disposed on a bottom surface of the window on the front surface part between first boundary lines defined as lines each of which connects both sides of each of the first long sides, the side surface parts, and the rear surface part between second boundary lines defined as lines each of which connects both sides of each of the second long sides parallel to face each other in the first direction.

In an embodiment, the front surface part may further include: a front display area disposed up to the first long sides, having a length less than that of each of the first long sides in the second direction, and disposed between first boundary lines defined as lines each of which connects both sides of each of the first long sides parallel to face each other in the first direction; and front non-display areas disposed with the front display area therebetween in the second direction.

In an embodiment, the side surface parts may include: a first side surface part extending from one first long side of the first long sides; and a second side surface part extending from the other first long side of the first long sides, and the rear surface part may extend from the second side surface part.

In an embodiment, the first side part may include: a first side display area extending from the front display area; and a first side non-display area extending from the front non-display areas and disposed around the first side display area.

In an embodiment, the second side surface part may include: a second side display area extending from the front display area; and second side non-display areas extending from the front non-display areas. The second side non-display areas may be disposed with the second side display area therebetween in the second direction, and the second side display area may be disposed up to both boundary lines of the second side surface part in the first direction.

In an embodiment, the rear surface part may further include: a rear display area extending from the second side display area; and a rear non-display area extending from the second side non-display areas and disposed around the rear display area.

In an embodiment, the display panel may include: a display area configured to display an image; and a non-display area surrounding the display area, and the display area may overlap the front display area, the first side display area, the second side display area, and the rear display area.

In an embodiment, the display apparatus may further include: a first support having a rectangular shape having short sides in the first direction and long sides in the second direction; a second support disposed on the first support in the second direction; and a third support disposed under the first support in the second direction. The second support and the third support may have shapes symmetrical to each other in the second direction, the second support may have a lower portion length greater than an upper portion length thereof, the third support may have an upper portion length greater than a lower portion length thereof, and each of both side surfaces of the second support in the first direction and both side surfaces of the third support in the first direction may have a convexly curved quarter-circular shape.

In an embodiment, the front surface part may be disposed on a front surface of the first support, a front surface of the second support, and a front surface of the third support, the side surface parts may be disposed on side surfaces of the first support, the rear surface part may be disposed under a rear surface of the first support, a rear surface of the second support, and a rear surface of the third support, and the display panel may be disposed between the window and the first support.

In an embodiment, the display apparatus may further include brackets disposed to cover a top surface of the second support, a bottom surface of the third support, both side surfaces of the second support, and the both side surfaces of the third support.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
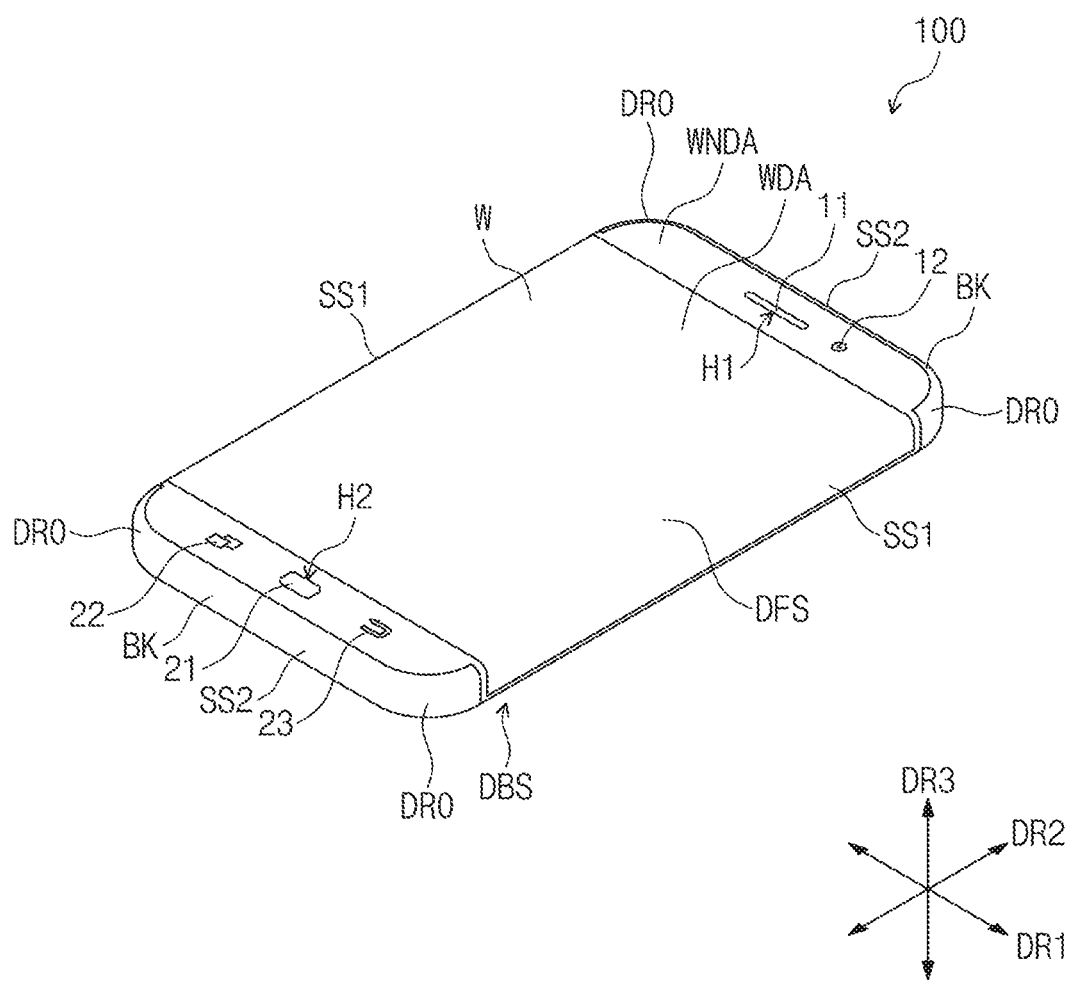
FIG. 1 is a perspective view of a display apparatus according to an embodiment of the inventive concept.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided as examples to convey the scope of the inventive concept to those skilled in the art. Further, the present disclosure is only defined by the scope of the claims. Like reference numerals refer to like elements throughout.

It will also be understood that when an element or a layer is referred to as being "on" another element or layer, it may be directly on the other element or layer, or intervening layers or elements may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout.

It will be understood that, although the terms "first," "second," etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of the present invention.

The embodiments in the detailed description will be described with schematic cross-sectional views and/or plan views as exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the inventive concept.

Hereinafter, exemplary embodiments of the inventive concept will be described below in more detail with reference to the accompanying drawings.

FIG. 1 is a perspective view of a display apparatus according to an embodiment of the inventive concept.

Referring to FIG. 1, a display apparatus 100 may have a short side in a first direction DR1 and a long side in a second direction DR2 crossing the first direction DR1. Hereinafter, a direction crossing a plane parallel to the first direction DR1 and the second direction DR2 is defined as a third direction DR3 (or normal direction).

The display apparatus 100 includes a front surface DFS, first side surfaces SS1 respectively extending from both sides in the first direction DR1 of the front surface DFS in the third direction DR3, a rear surface DBS facing the front surface DFS, second side surfaces SS2 respectively extending from both sides in the second direction DR2 of the front surface DFS in the third direction DR3, and rounded surfaces DRO respectively connecting each of the both sides of the first side surfaces SS1 to each of the both sides of the second side surfaces SS2, which are disposed adjacent to each other.

Each of the rounded surfaces DRO has a convexly curved quarter-circular shape. Each of the first side surfaces SS1 corresponds to the long side of the display apparatus 100, and each of the second side surfaces SS2 correspond to the short side of the display apparatus 100. The display apparatus 100 may be a four-surface display apparatus capable of displaying an image on the front surface DFS, the first side surfaces SS1, and the rear surface DBS.

The display apparatus 100 may include a window W, an acoustic element 11, a camera 12, user input parts 21, 22, and 23, and brackets BK. The window W is disposed on the front surface DFS, the rear surface DBS, and the first side surfaces SS1 of the display apparatus 100. That is, the window W may provide the front surface DFS, the rear surface DBS, and the first side surfaces SS1 of the display apparatus 100.

The window W includes a window display area WDA and a window non-display area WNDA disposed around the window display area WDA. The window display area WDA and the window non-display area WNDA of the window W will be described below in detail with reference to FIGS. 3 and 4. The image generated from the display apparatus 100 may pass through the window display area WDA and be provided to the user. The window non-display area WNDA does not display the image.

The window non-display areas WNDA of the window W, which is disposed on the front surface DFS of the display apparatus 100, are disposed with the window display area WDA therebetween in the second direction DR2. The window non-display areas WNDA of the window W, which is disposed on the front surface DFS of the display apparatus 100, may be peripheral areas disposed around an upper end and a lower end of the window display area WDA.

The window W may have flexibility. For example, the window W may include a polymer material such as polyethyleneterephthalate (PET), polycarbonate (PC), polyimide (PI), and polymethylmethacrylate (PMMA), which are plastic materials having flexibility. Alternatively, thin film glass having a thickness equal to or less than several hundreds μm may be used as the window W having the flexibility.

The acoustic element 11 and the camera 12 are disposed on a predetermined area of the window non-display area WNDA disposed adjacent to the upper end of the window display area WDS disposed on the front surface DFS of the display apparatus 100. The acoustic element 11 may be a speaker providing voice to the user. A first hole H1 for exposing the acoustic element 11 may be defined in the window non-display area WNDA below which the acoustic element 11 is disposed.

The user input parts 21, 22, and 23 are disposed on a predetermined area of the window non-display area WNDA disposed adjacent to the lower end of the window display area WDA disposed on the front surface DFS of the display apparatus 100. The user input parts 21, 22, and 23 include a key button 21 and touch key buttons 22 and 23, which are operable by the user. When the key button 21 and the touch key buttons 22 and 23 are operated, the images displayed on the window display area WDA may be converted to different images.

The user may physically depress the key button 21 to operate it. The touch key buttons 22 and 23 may be touch sensors, and the user may touch to operate the touch key buttons 22 and 23. A second hole H2 for exposing the key button 21 may be defined in the window non-display area WNDA below which the key button 21 is disposed.

The brackets are disposed on the second side surfaces SS2 and the rounded surfaces DRO of the display apparatus 100. The brackets provide the second side surfaces SS2 and the rounded surfaces DRO of the display apparatus 100. One of the brackets BK is disposed on the second side surface SS2 and the rounded surfaces DRO disposed on the upper portion of the display apparatus 100, and the other of the brackets BK is disposed on the second side surface SS2 and the rounded surfaces DRO disposed on the lower portion of the display apparatus 100.

Although not shown, the sensors may be disposed on the window non-display area WNDA disposed on the front surface DFS of the display apparatus 100. Also, ports, for example, for connecting to a microphone, an external power or electronic devices, may be disposed on the second side surfaces SS2.

Figure 2:
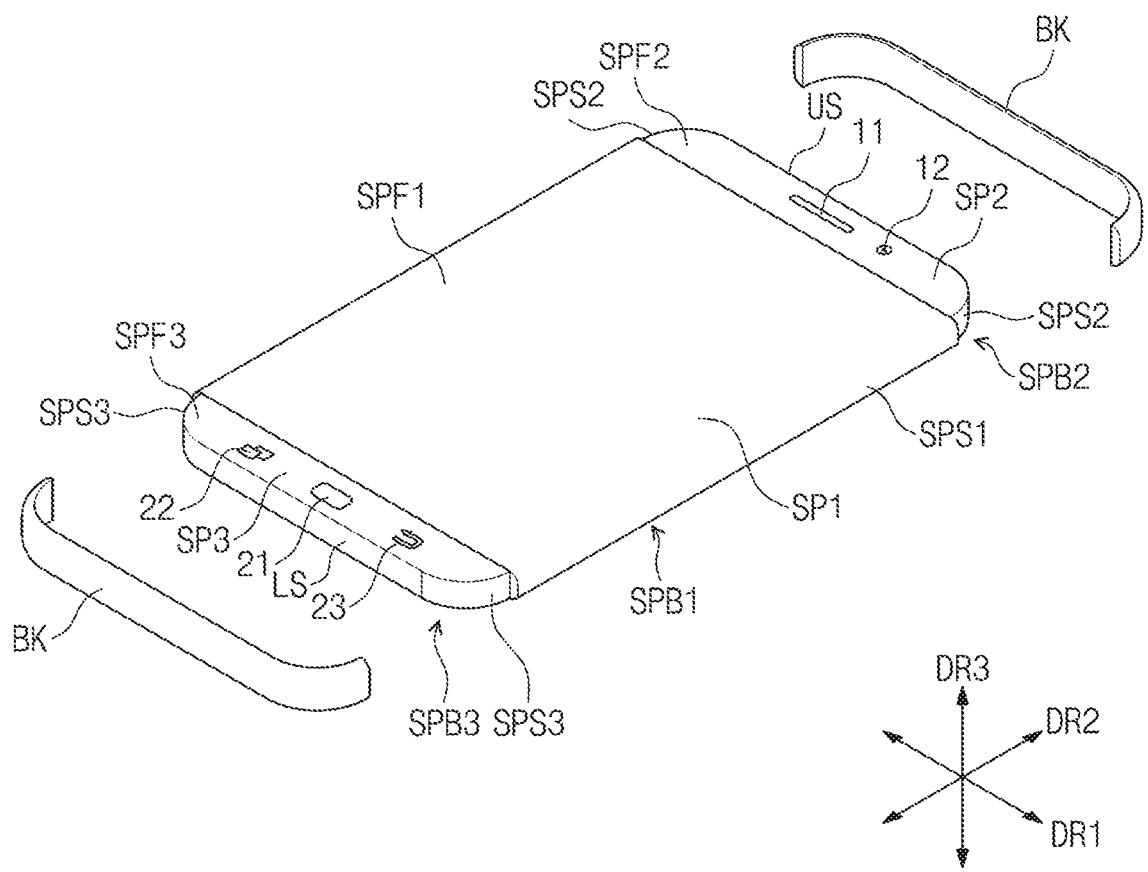
FIG. 2 is a view illustrating a state in which supports disposed in the display apparatus in FIG. 1 and brackets are separated.
Figure 3:
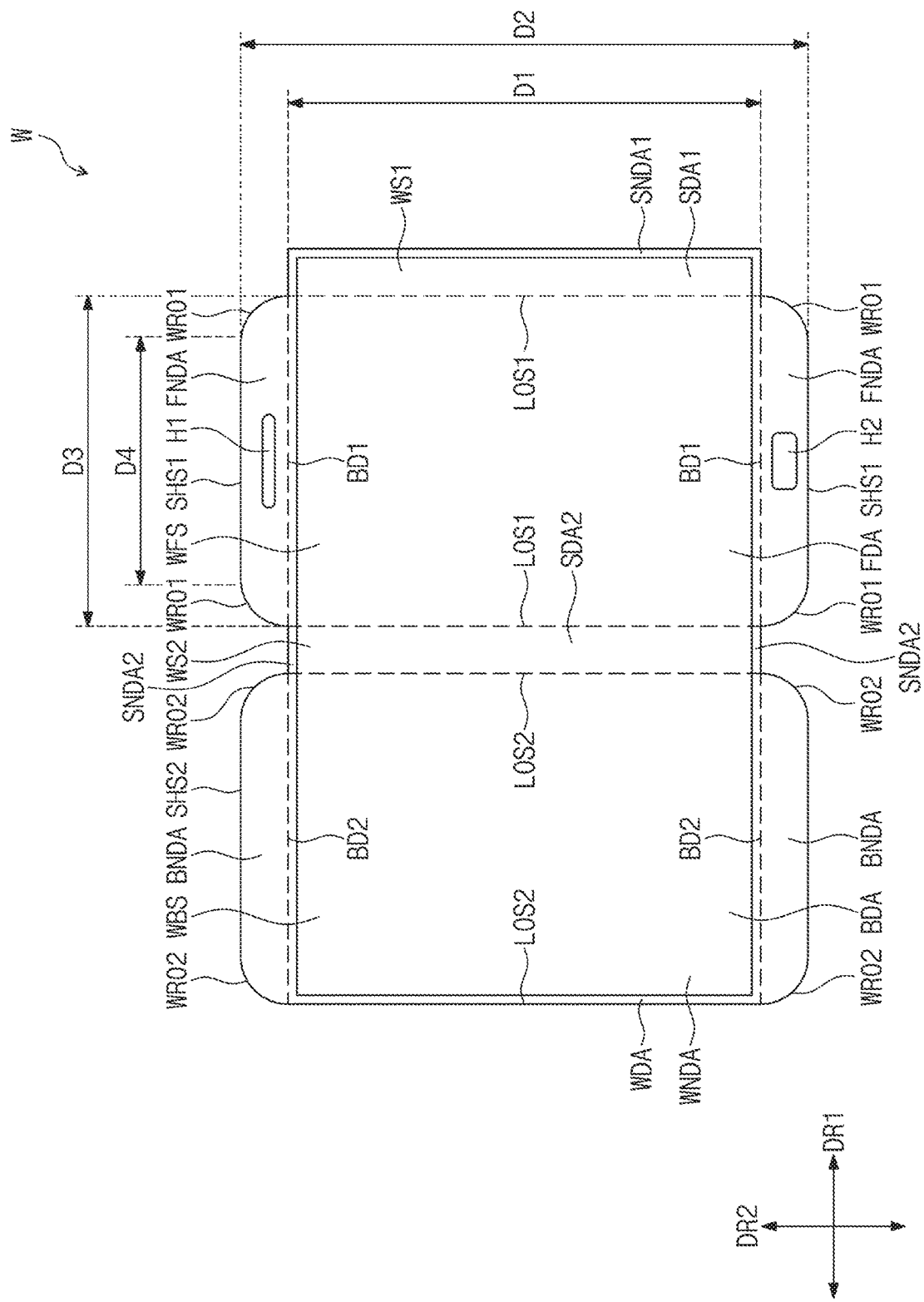
FIG. 3 is a plan view illustrating a state in which a window of the display apparatus in FIG. 1 is completely unfolded.
Figure 4:
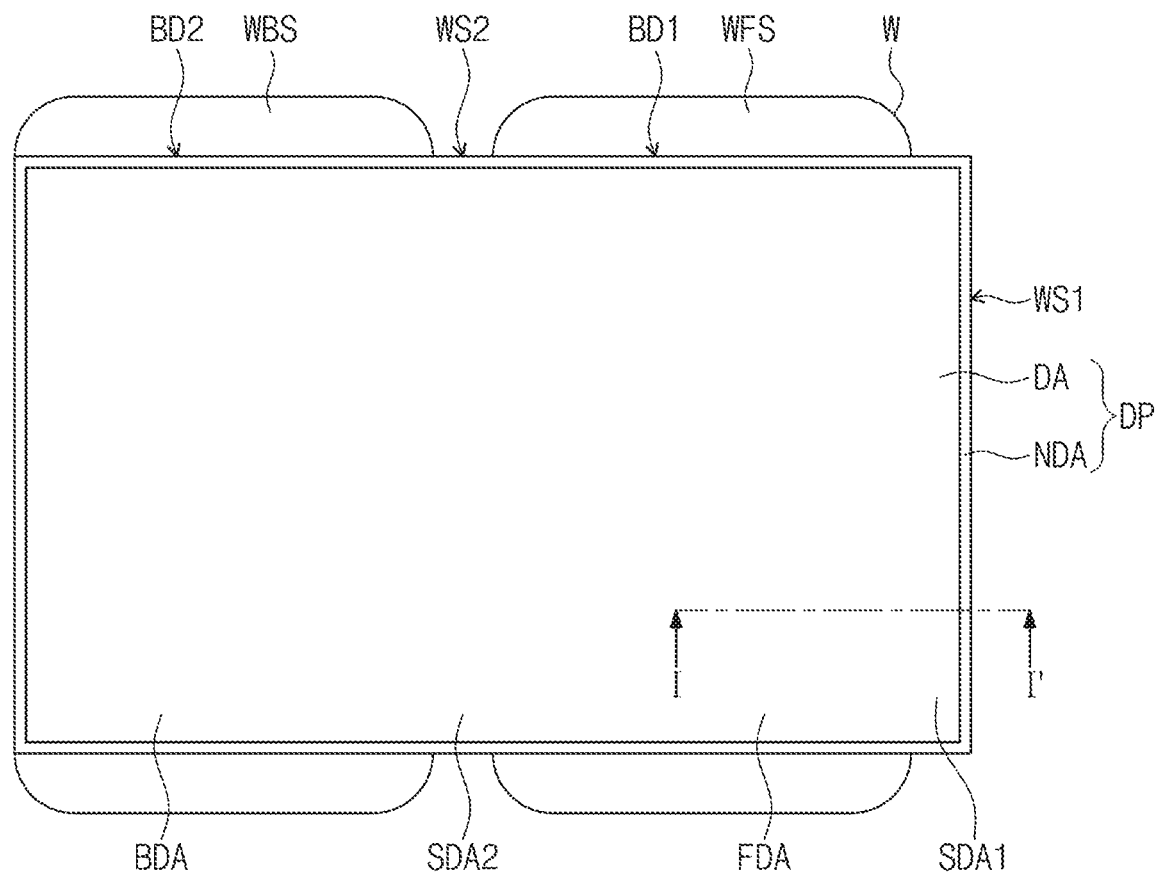
FIG. 4 is a view illustrating a display panel attached to a bottom surface of the window in FIG. 3.
Figure 5:
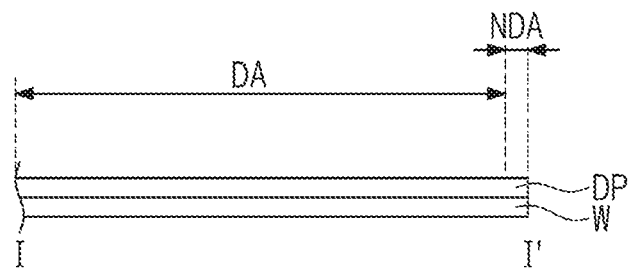
FIG. 5 is a cross-sectional view taken along line I-I' of FIG. 4.

FIGS. 2, 3, and 4 are exploded views of the display apparatus in FIG. 1. FIG. 2 is a view illustrating a state in which supports SP1, SP2, and SP3 disposed in the display apparatus 100 in FIG. 1 and the brackets BK are separated. FIG. 3 is a plan view of the window W illustrating a state in which the window W of the display apparatus 100 in FIG. 1 is completely unfolded. FIG. 4 is a view illustrating a display panel DP attached to a bottom surface of the window W in FIG. 3. FIG. 5 is a cross-sectional view taken along line I-I' of FIG. 4.

Referring to FIG. 2, the display apparatus 100 includes a first support SP1, a second support SP2 disposed above the first support SP1 in the second direction DR2, and a third support SP3 disposed below the first support SP1 in the second direction DR2. The brackets BK are disposed above the second support SP2 and below the third support SP3.

The first support SP1 has a rectangular shape having a short side in the first direction DR1 and a long side in the second direction DR2. Although not shown, the first support SP1 may include a battery and a system board of the display apparatus 100. The battery may provide power used for the display apparatus 100 to the elements of the display apparatus, and the system board may control the operations of the display apparatus 100.

The second support SP2 and the third support SP3 may have shapes symmetric to each other in the second direction DR2. The second support SP2 has a lower portion length greater than an upper-end length thereof, and the third support SP3 has an upper-end length greater than a lower portion length thereof. The second support SP2 may include the acoustic element 11 and the camera 12, and the third support SP3 may include the user input parts 21, 22, and 23.

A front surface SPF1 of the first support SP1, a front surface SPF2 of the second support SP2, and a front surface SPF3 of the third support SP3 correspond to the front surface DFS of the display apparatus 100. A rear surface SPB1 of the first support SP1, a rear surface SPB2 of the second support SP2, and a rear surface SPB3 of the third support SP3 correspond to the rear surface DBS of the display apparatus 100.

Side surfaces SPS1 of the first support SP1 correspond to the first side surfaces SS1 of the display apparatus 100 in the first direction DR1, and a top surface US of the second support SP2 and a bottom surface LS of the third support SP3 respectively correspond to second side surfaces SS2 of the display apparatus 100 in the second direction DR2. Each of both side surfaces SPS2 of the second support SP2 and both side surfaces SPS3 of the third support SP3 in the first direction DR1 has a convexly curved quarter-circular shape to correspond to each of the rounded surfaces DRO.

Referring to FIG. 3, the window W includes a front surface part WFS, side surface parts WS1 and WS2 extending from both sides of the front surface part WFS of the window W in the first direction DR1, and a rear surface part WBS extending from one of the side surface parts WS1 and WS2 in the first direction DR1. The front surface part WFS and the rear surface part WBS have the same shape as each other. Here, the first hole H1 and the second hole H2 are defined in the front surface part WFS.

The first hole H1 and the second hole H2 may be defined by removing a predetermined area of the window W, below which the acoustic element 11 and the key button 21 are disposed, to expose the acoustic element 11 and the key button 21. For convenience in description, boundaries of the front surface part WFS, the side surface parts WS1 and WS2, and the rear surface part WBS are expressed as dotted lines in FIG. 3.

The front surface part WFS of the window W includes first short sides SHS1 extending in the first direction DR1 to face each other in the second direction DR2, first long sides LOS1 extending in the second direction DR2 to face each other in the first direction DR1, and first rounded parts WRO1 each of which has a curved shape, respectively extending from both sides of the first long sides LOS1, and respectively connected to both sides of the first short sides SHS1 disposed adjacent to the first long sides LOS1.

The side surface parts WS1 and WS2 include a first side surface part WS1 extending from one of the first long sides LOS1 of the front surface part WFS in the first direction DR1 and a second side surface part WS2 extending from the other thereof in the first direction DR1. The rear surface part WBS may extend from the second side surface part WS2 in the first direction DR1. Each of the first and second side surface parts WS1 and WS2 of the window W may have a rectangular shape having a short side in the first direction DR1 and a long side in the second direction DR2.

Each of the first long sides LOS1 of the front surface part WFS of the window W has a first length D1, and each of the first and second side surface parts WS1 and WS2 has a first length D1 in the second direction DR2. A length between the first short sides SHS1 of the front surface part WFS of the window W has a second length D2 greater than the first length D1. That is, the front surface part WFS of the window W has a length greater than that of each of first and second side surface parts WS1 and WS2 of the window W in the second direction DR2.

A length between the first long sides LOS1 of the front surface part WFS of the window W has a third length D3 less than the first length D1. Each of the first short sides SHS1 of the front surface part WFS of the window W has a fourth length D4 less than the third length D3. Each of the first rounded parts WRO1 has a convexly curved quarter-circular shape.

The rear surface part WBS of the window W has the same shape as the front surface part WFS of the window W. For example, the rear surface part WBS includes second short sides SHS2 respectively corresponding to the first short sides SHS1, second long sides LOS2 respectively corresponding to the first long sides LOS1, and second rounded parts WRO2 respectively corresponding to the first rounded parts WRO1. The configuration of the rear surface part WBS is substantially the same as that of the front surface part WFS except for the numerical symbols, and thus detailed description for the configuration of the rear surface part WBS will be omitted.

The window W includes a window display area WDA and a window non-display area WNDA disposed around the window display area WDA. In detail, the front surface part WFS of the window W includes a front display area FDA and front non-display areas FNDA disposed with the front display area FDA therebetween in the second direction DR2. The front display area FDA is disposed up to the first long sides LOS1 of the front surface part WFS of the window W in the first direction DR1, and the front display area FDA has a length less than the first length D1 that is a length of each of the first long sides LOS1 in the second direction DR2.

Lines connecting both sides of the first long sides LOS1, which are parallel to each other to face each other in the first direction DR1, of the front surface part WFS are defined as first boundary lines BD1. For convenience in description, the first boundary lines BD1 are expressed as dotted lines. The front display area FDA is disposed between the first boundary lines BD1.

The first side surface part WS1 includes a first side display area SDA1 extending from the front display area FDA and a first side non-display area SNDA1 extending from the front non-display area FNDA and disposed around the first side display area SDA1. The first side non-display area SNDA1 may be disposed on a predetermined area of both sides of the first side surface part WS1 and a predetermined area of one side of the first side surface part WS1 that is an opposite side of the other side of the first side surface part WS1 extending from the front surface part WFS in the second direction DR2.

The second side surface part WS2 includes a second side display area SDA2 extending from the front display area FDA and second side non-display areas SNDA2 extending from the front non-display area FNDA. The second side non-display areas SNDA2 are disposed with the second side display area SDA2 therebetween in the second direction DR2. The second side display area SDA2 is disposed up to both boundaries of the second side surface part WS2 in the first direction DR1.

The rear surface part WBS of the window W includes a rear display area BDA extending from the second side display area SDA2 and a rear non-display area BNDA extending from the second side non-display area SNDA2 and disposed around the rear display area BDA. In the second direction DR2, the rear display area BDA has a length less than the first length D1.

Lines connecting both sides of the second long sides LOS2, which are parallel to each other and facing each other in the first direction DR1, of the rear surface part WBS are defined as second boundary lines BD2. For convenience in description, the second boundary lines BD2 are expressed as dotted lines. The rear display area BDA is disposed between the second boundary lines BD2 and spaced a predetermined length from one side of the rear surface part WBS that is an opposite side of the other side of the rear surface part WBS extending from the second side surface part WS2.

The front display area FDA, the rear display area BDA, the first side display area SDA1, and the second side display area SDA2 provide the window display area WDA. The front non-display area FNDA, the rear non-display area BNDA, the first side non-display area SNDA1, and the second side non-display area SNDA2 provide the window non-display area WNDA.

Referring to FIGS. 4 and 5, the display panel DP is disposed on the window W. The window W may protect the display panel DP from external scratches.

The display panel DP includes a plurality of pixels (not shown) for displaying an image. The configuration of the pixels will be described below in detail in FIGS. 8 and 9. The display panel DP may have flexibility. For example, as the display panel DP includes a substrate made of a plastic material having flexibility and the pixels are disposed on the substrate, the display panel DP may have the flexibility.

Various display panels such as an organic light emitting display panels, a liquid crystal display panel, an electro wetting display panel, and an electrophoretic display panel may be used as the display panel DP. For example, according to an embodiment of the inventive concept, the display panel DP may be an organic light emitting display panel including organic light emitting elements.

The display panel DP may be disposed on a bottom surface of the window W on the front surface part WFS between the first boundary lines BD1, the first side surface part WS1, the second side surface part WS2, and the rear surface part WBS between the second boundary lines BD2. The display panel DP includes a display area DA and a non-display area NDA surrounding the display area DA. The display area DA of the display panel DP overlaps the front display area FDA, the first side display area SDA1, the second side display area SDA2, and the rear display area BDA.

Although not shown, the display panel DP may be attached to the window W by using an adhesion member. The adhesion member for attaching the display panel DP to the window W may include optical clear adhesive (OCA) or pressure sensitive adhesive (PSA).

Although not shown in the drawings, a touch panel may be disposed between the window W and the display panel DP. An input signal is generated from the touch panel by user's touch, and the display panel DP provides an image corresponding to the input signal in response to the input signal provided from the touch panel. The image generated from the display panel DP may pass through the window display area WDA of the window W and be provided to the user.

Figure 6:
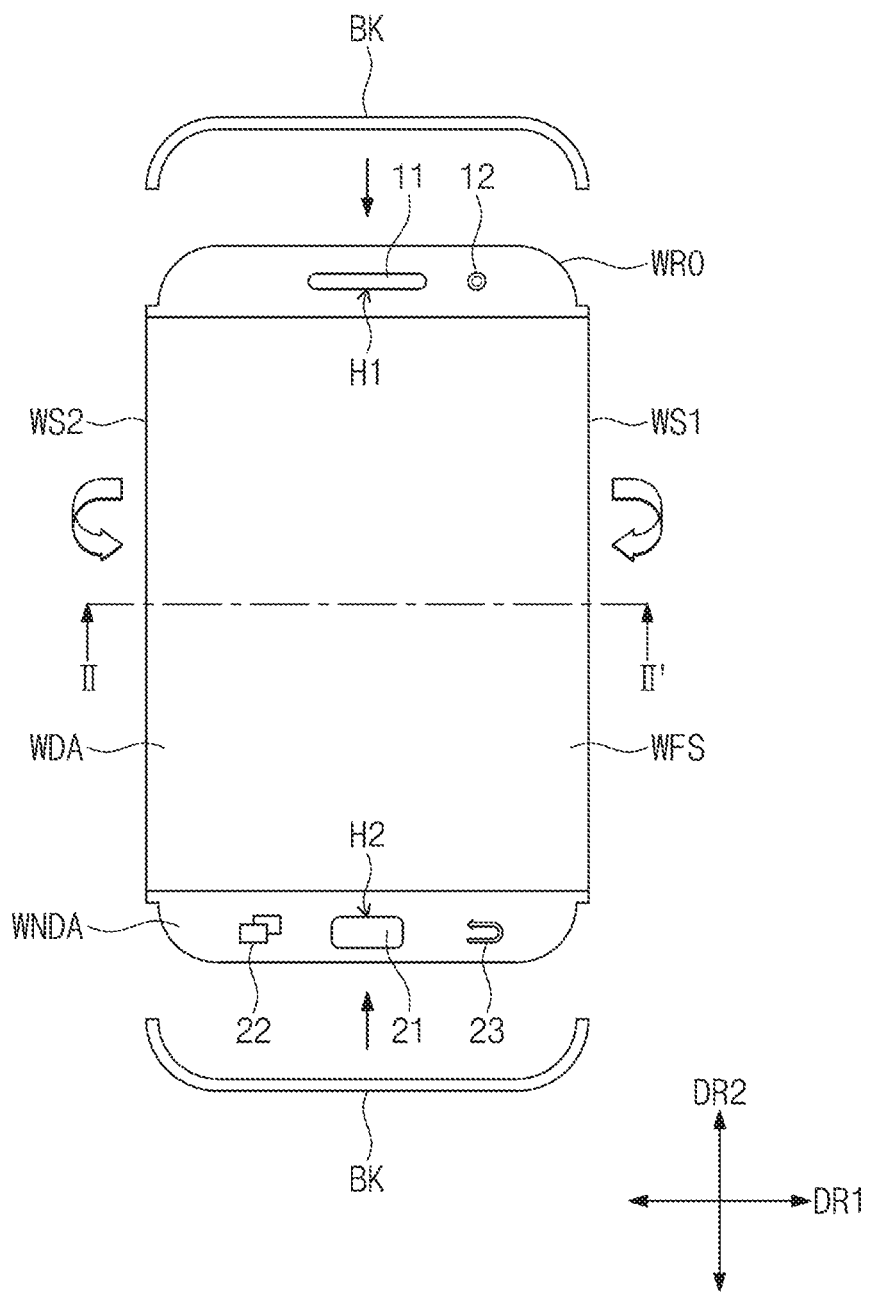
FIG. 6 is a view illustrating a state in which the window is bent to cover first, second, and third supports.
Figure 7:
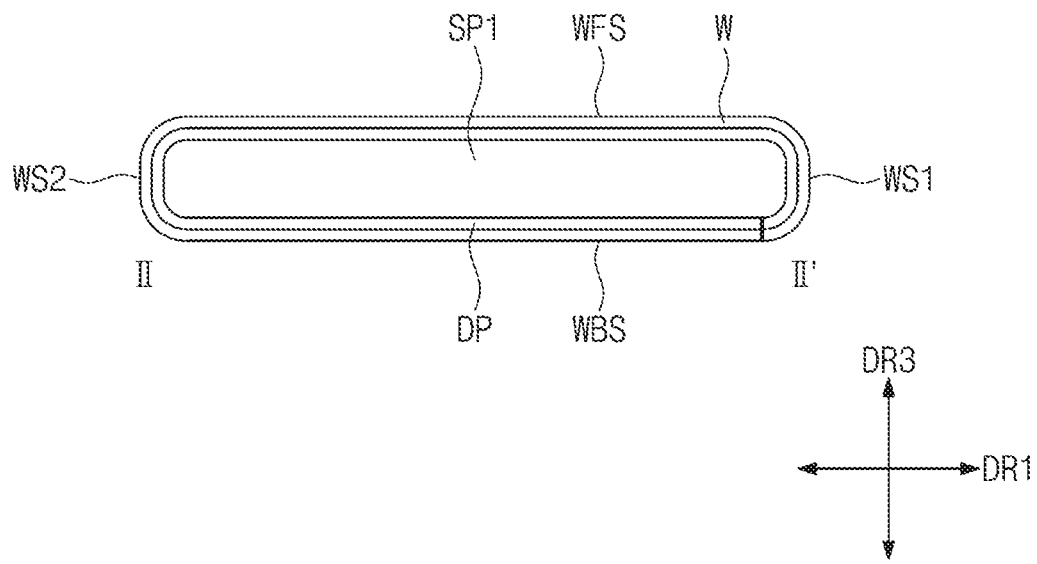
FIG. 7 is a cross-sectional view taken along line II-II' of FIG. 6.

FIG. 6 is a view illustrating a state in which the window is bent to cover the first, second, and third supports. FIG. 7 is a cross-sectional view taken along line II-II' of FIG. 6.

Referring to FIGS. 6 and 7, the display panel may be disposed below the window W, and the window W may be bent to cover the first, second, and third supports SP1, SP2, and SP3.

In detail, the display panel DP is disposed below the window W, and the front surface part WFS of the window W is disposed on the front surface SPF1 of the first support SP1, the front surface SPF2 of the second support SP2, and the front surface SPF3 of the third support SP3. The first and second side surface parts WS1 and WS2 of the window W are bent in the third direction DR3 and disposed on the side surfaces SPS1 of the first support SP1.

The rear surface part WBS of the window W is bent from the second side surface part WS2 in the first direction DR1 to overlap the front surface part WFS of the window W, thereby facing each other. As a result, the rear surface part WBS is disposed below the rear surface SPB1 of the first support SP1, the rear surface SPB2 of the second support SP2, and the rear surface SPB3 of the third support SP3. The brackets BK are disposed to cover the top surface US of the second support SP2, the bottom surface LS of the third support SP3, both side surfaces SPS2 of the second support SP2, and both side surfaces SPS3 of the third support SP3.

As a result, the window W and the brackets BK may cover the first, second, and third supports SP1, SP2, and SP3 to manufacture the display apparatus 100. The display panel DP is disposed in a space in which the first and second side surface parts WS1 and WS2 are bent from the front surface part WFS of the window W, and the rear surface part WBS is bent from the second side surface part WS2. Accordingly, the display panel DP may be disposed between the window W and the first support SP1.

When the display apparatus does not include the rounded surface DRO but has a rectangular shape to display an image on the four surfaces of the display apparatus, the window extending to have a rectangular shape in the first direction DR1 may be bent to be disposed on the four surfaces of the display apparatus. The four surfaces of the display apparatus include the front surface and the rear surface of the display apparatus and both side surfaces of the display apparatus in the first direction DR1. However, when a corner portion of the display apparatus has a rounded shape to provide the rounded surfaces DRO, the window extending to have a rectangular shape in the first direction DR1 may not be disposed on the rounded surfaces DRO although bent.

According to an embodiment of the inventive concept, the window W includes the front surface part WFS including rounded portions WRO1 and WRO2 corresponding to the rounded surfaces DRO and the first and second side surfaces WS1 and WS2 that are not disposed on the rear surface part WBS and the rounded surfaces DRO but disposed on the first side surfaces SS1 of the display apparatus 100. Accordingly, the window W suitable to the display apparatus 100 having rounded surfaces DRO to display the image on the four surfaces may be provided.

Figure 8:
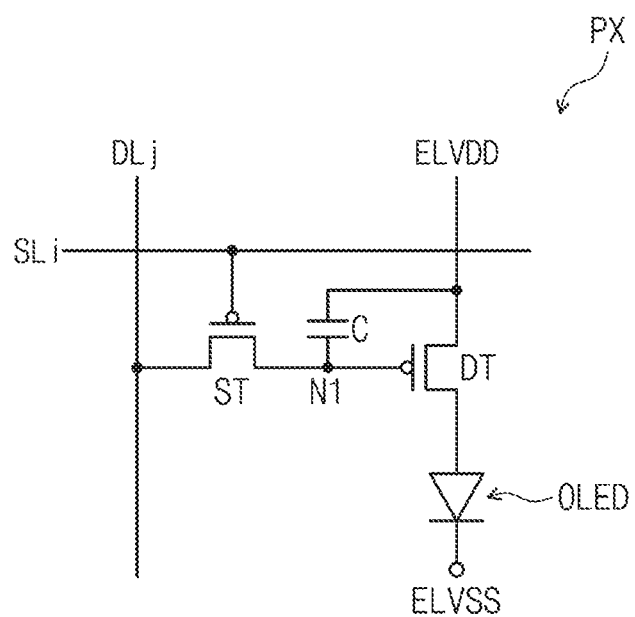
FIG. 8 is a view illustrating an equivalent circuit of one pixel of pixels of the display panel in FIG. 4.
Figure 9:
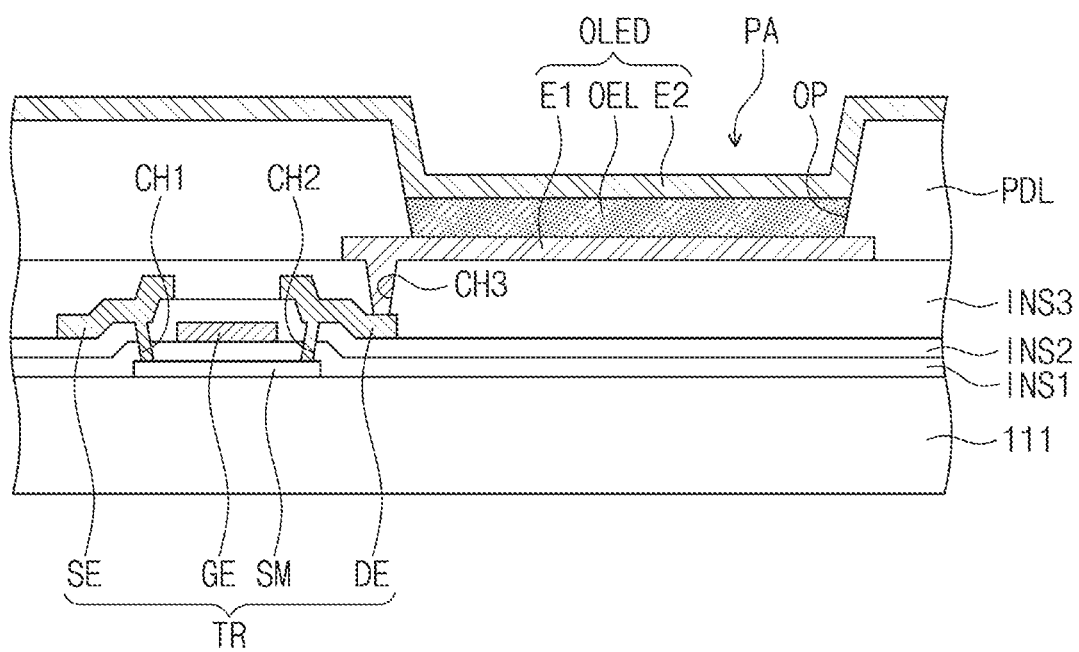
FIG. 9 is a schematic view illustrating a cross-sectional configuration of the pixel in FIG. 8.

FIG. 8 is a view illustrating an equivalent circuit of one pixel of pixels of the display panel in FIG. 4. FIG. 9 is a schematic view illustrating a cross-sectional configuration of the pixel in FIG. 8.

Although one pixel PX is illustrated in FIGS. 8 and 9, other pixels PX may have the same configuration as the pixel PX in FIGS. 8 and 9.

Referring to FIG. 8, the pixel PX includes a light emitting element OLED, a driving element DT, a capacitive element C, and a switching element ST. The light emitting element may be an organic light emitting layer including an organic light emitting layer. Each of the driving element DT and the switching element ST is a P-type transistor. An embodiment of the inventive concept is not limited to the type of the driving element DT and the switching element ST. For example, each of the driving element DT and the switching element ST may be an N-type transistor. The capacitive element C may be a capacitor.

The driving element DT includes an input terminal receiving a first electrode of the capacitive element C and a first power voltage (ELVDD), an output terminal connected to the input terminal (or anode electrode) of the light emitting element OLED, and a control terminal connected to an output terminal of the switching transistor ST.

A second electrode of the capacitive element C is connected to a control terminal of the driving element DT. An output terminal (or cathode electrode) of the light emitting element OLED receives a second power voltage ELVSS. The switching element ST includes an input terminal connected to a data line DLj, an output terminal connected to a control terminal of the driving element DT, and a control terminal connected to a scan line SLi. Here, i and j are natural numbers.

An injection signal is applied to the control terminal of the switching element ST through the injection line SLi, and the switching element is turned-on in response to the injection signal. The turned-on switching element ST provides a data voltage that is received through the data line DLj to a first node N1. The capacitive element C charges the data voltage provided to the first node N1, and the charged data voltage is maintained even after the switching element ST is turned-off.

The driving element DT is turned on by receiving the data voltage charged in the capacitive element C. The driving element DT may be turned on until the data voltage charged in the capacitive element C is completely discharged. The turned-on driving element DT receives the first power voltage ELVDD. Accordingly, the light emitting element OLED receives current through the driving element DT to emit light. The light emitting element OLED may emit light to display an image corresponding to the data voltage.

Referring to FIG. 9, the pixel PX includes a light emitting element OLED and a transistor TR connected to the organic light emitting diode OLED. The light emitting element may be an organic light emitting diode OLED. The transistor TR is the driving element DT in FIG. 8.

The transistor TR is disposed on a base substrate 111. The base substrate 111 may be a transparent flexible substrate made of a glass substrate or plastic. A semiconductor layer SM of the transistor TR is disposed on the base substrate 111. The semiconductor layer SM may include an inorganic material semiconductor such as amorphous silicon or poly silicone or an organic semiconductor. Also, the semiconductor layer SM may include an oxide semiconductor.

A first insulation film INS1 is disposed on the base substrate 111 to cover the semiconductor layer SM. The first insulation film INS1 may be an inorganic insulation film including an inorganic material. A gate electrode GE of the transistor TR overlapping the semiconductor layer SM is disposed on the first insulation film INS1. The gate electrode GE may be disposed to overlap a channel area of the semiconductor layer SM.

A second insulation film INS2 is disposed on the first insulation film INS1 to cover the gate electrode GE. The second insulation film INS2 may be defined as an interlayer insulation film. The second insulation film INS2 may be an inorganic insulation film including an inorganic material.

A source electrode SE and a drain electrode DE of the transistor TR are spaced apart from each other on the second insulation film INS2. Although not shown in FIG. 9, the semiconductor layer SM may include a source area, a drain area, and a channel area between the source area and the drain area.

The source electrode SE may be connected to the source area of the semiconductor layer SM through a first contact hole CH1 defined by passing through the first insulation film INS1 and the second insulation film INS2.

The drain electrode DE may be connected to the drain area of the semiconductor layer SM through a second contact hole CH2 defined by passing through the first insulation film INS1 and the second insulation film INS2.

A third insulation film INS3 is disposed on the second insulation film INS2 to cover the source electrode SE and the drain electrode DE of the transistor TR. The third insulation film INS3 may be an organic insulation film including an organic material.

A first electrode E1 of the light emitting element OLED is disposed on the third insulation film INS3. The first electrode E1 may be connected to the drain electrode DE of the transistor TR through a third contact hole CH3 defined by passing through the third insulation layer INS3. The first electrode E1 may be a pixel electrode or an anode electrode. The first electrode E1 may include a transparent electrode or a reflective electrode.

A pixel defining layer PDL exposing a predetermined area of the first electrode E1 is disposed on the first electrode E1 and the third insulation layer INS3. The pixel defining layer PDL includes an opening OP exposing a predetermined area of the first electrode E1. An area on which the opening OP is disposed is defined as a pixel area PA.

An organic light emitting layer OEL is disposed on the first electrode E1 within the opening OP. The organic light emitting layer OEL may include an organic material capable of generating one light of red, green, and blue light. Accordingly, the organic light emitting layer OEL may generate one light of red, green, and blue light. However, an embodiment of the inventive concept is not limited to the color of the light. For example, the organic light emitting layer OEL may generate white light through a combination of organic materials respectively generating red, green, and blue light.

The organic light emitting layer OEL may include a low molecular organic material or a high molecular organic material. Although not shown, the organic light emitting layer OEL may be provided as a multi-layer film including a hole injection layer (HIL), a hole transporting layer (HTL), an emission layer (EML), an electron transporting layer (ETL), and an electron injection layer (EIL).

As an exemplary embodiment, the hole injection layer may be disposed on the first electrode E1, and the hole transporting layer, the emission layer, the electron transporting layer, and the electron injection layer may be sequentially laminated on the hole injection layer.

A second electrode E2 is disposed on the pixel defining layer PDL and the organic light emitting layer OEL. The second electrode EL2 may be defined as a common electrode or a cathode electrode. The second electrode E2 may include a transparent electrode or a reflective electrode.

When the display panel DP is a front light emitting type display panel, the first electrode E1 may be the reflective electrode, and the second electrode E2 may be the transparent electrode. When the display panel DP is a rear light emitting type display panel, the first electrode E1 may be the transparent electrode, and the second electrode E2 may be the reflective electrode.

The light emitting element OLED is provided on the pixel area PA, and the pixel area PA includes the first electrode E1, the organic light emitting layer OEL, and the second electrode E2. The first electrode E1 may be an anode that is the hole injection electrode, and the second electrode E2 may be a cathode that is the electron injection electrode.

The first power voltage ELVDD is applied to the first electrode E1 to allow the organic light emitting layer OEL of the light emitting element OLED to emit light by the transistor TR, and the second power voltage ELVSS that has a polarity opposite to the first power voltage ELVDD is applied to the second electrode E2.

In this case, a hole and an electron that are injected into the organic light emitting layer OEL are coupled to each other to provide an exciton, and the exciton is transferred to a ground state to allow the light emitting element OLED to emit light. The light emitting element OLED may emit the red, green, or blue light according to current flow to display a predetermined image information.

Figure 10:
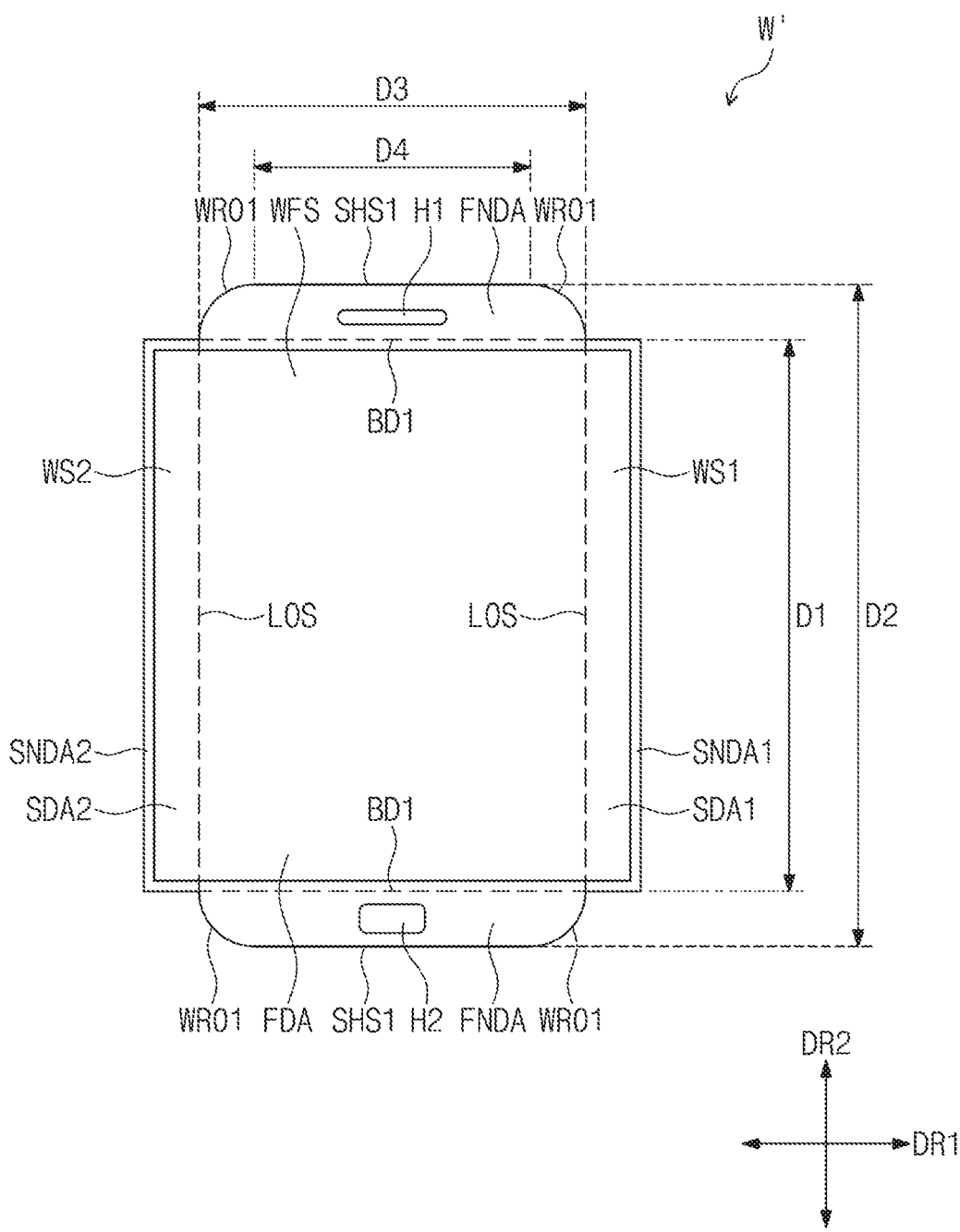
FIG. 10 is a view illustrating a planar configuration of a window of a display apparatus according to another embodiment of the inventive concept.
Figure 11:
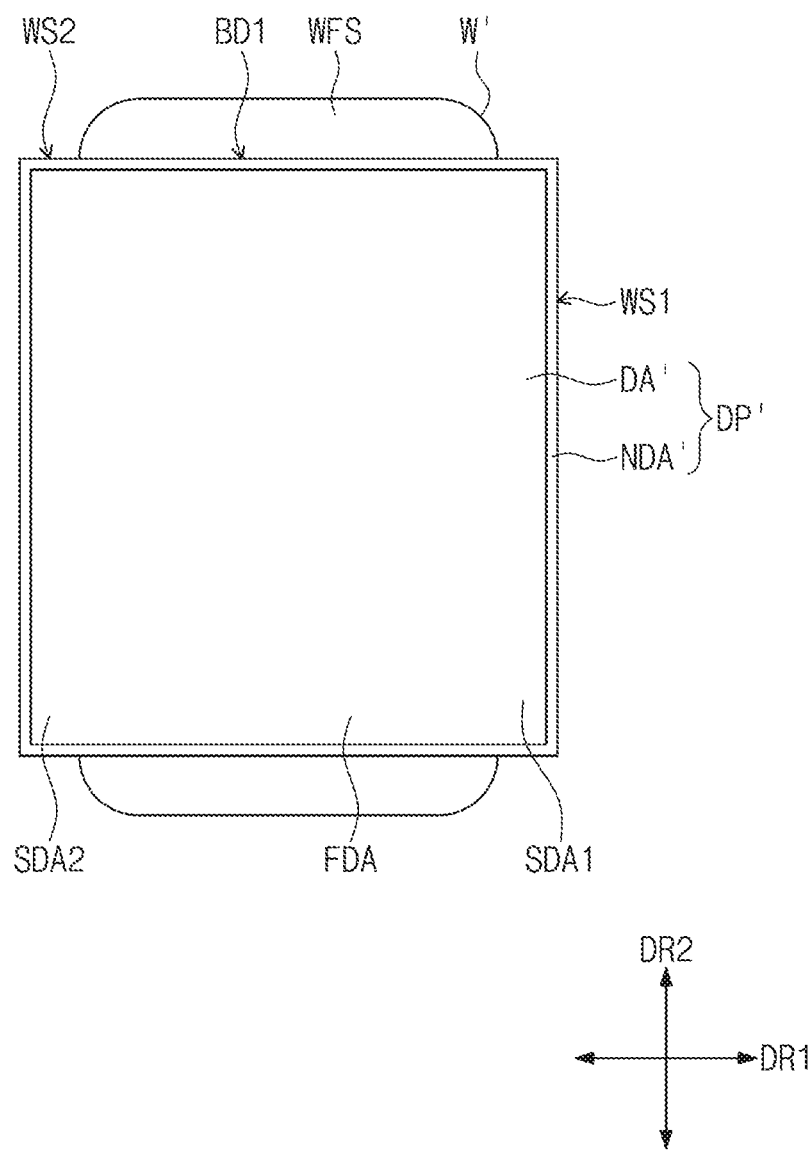
FIG. 11 is a view illustrating a display panel attached to a bottom surface of the window in FIG. 10.
Figure 12:
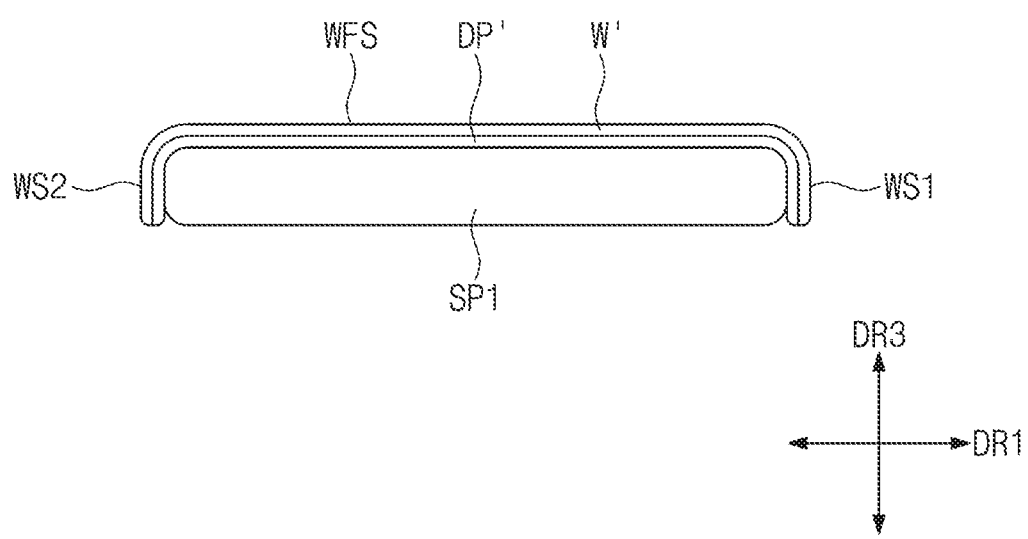
FIG. 12 is a cross-sectional view illustrating a state in which the window in FIG. 10 is disposed on the display apparatus.

FIG. 10 is a view illustrating a planar configuration of a window of a display apparatus according to another embodiment of the inventive concept. FIG. 11 is a view illustrating a display panel attached to the bottom surface of the window in FIG. 10. FIG. 12 is a cross-sectional view illustrating a state in which the window is disposed on the display apparatus in FIG. 10. For convenience in description, FIG. 12 illustrates a cross-section corresponding to the cross-sectional view taken along line II-II' in FIG. 6.

Referring to FIGS. 10, 11, and 12, the display apparatus according to another embodiment of the inventive concept has the same configuration as the display apparatus 100 in FIG. 1 except for a configuration in which a window W' is disposed on three surfaces of the display apparatus displaying an image on the three surfaces thereof. The three surfaces of the display apparatus displaying an image may respectively correspond to the front surface DFS and the first side surfaces SS1 of the display apparatus 100 in FIG. 1.

In FIGS. 10 and 11, the same reference symbols are used for the same components of the window W' as those of the window W in FIG. 3. Substantially, the window W' has the same configuration as the window in which the rear surface part WBS is removed. For example, the window W' includes first and second side surface parts WS1 and WS2 extending from both sides of the front surface part WFS of the window W' in the first direction DR1.

Since the front surface part WFS and the first and second side surface parts WS1 and WS2 of the window W' are the same as the front surface WFS and the first and second side surface parts WS1 and WS2 of the window W in FIG. 3, detailed description regarding the front surface part WFS and the first and second side surface parts WS1 and WS2 of the window W' will be omitted.

A display panel DP' may be disposed on a bottom surface of the window W' on the front surface part WFS, the first side surface part WS1, and the second side surface part WS2 between the first boundary lines BD1. The display panel DP' includes a display area DA' and a non-display area NDA' surrounding the display area DA'.

The front surface part WFS of the window W' is disposed on the front surface SPF1 of the first support SP1, the front surface SPF2 of the second support SP2, and the front surface SPF3 of the third support SP3. The first and second side surface parts WS1 and WS2 of the window W' are bent to be disposed on the side surfaces SPS1 of the first support SP1 in the third direction DR3. The display panel DP' is disposed between the window W' and the first support SP1.

According to an embodiment of the inventive concept, the window W' includes the first and second side surface parts WS1 and WS2 that are not disposed on the front surface part WFS including first rounded parts WRO1 corresponding to the rounded surface DRO and the rounded surfaces DRO but disposed on the first side surfaces SS1 of the display apparatus 100. Accordingly, the window W' suitable to the display apparatus having the rounded surfaces DRO and displaying an image on the three surface may be provided.

Although exemplary embodiments of the present invention have been described, it is understood that the present invention should not be limited to these exemplary embodiments. Rather, various changes and modifications may be made by one ordinary skilled in the art within the spirit and scope of the present invention as hereinafter claimed. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display apparatus comprising:
a first support comprising a front surface, a rear surface opposite to the front surface, and one side surface and the other side surface opposite to each other in a first direction;
a display panel comprising a display area and a non-display area around the display area, and the display panel disposed on the front surface, the one side surface, and the rear surface; and
a window disposed on the display panel,
wherein the window comprises:
a front surface part disposed on the front surface;
a rear surface part disposed on the rear surface; and
a first side surface part disposed on the one side surface,
wherein the front surface part, the first side surface part, and the rear surface part surround the display panel, and the display area extends along the front surface, the one side surface, and the rear surface.

2. The display apparatus of claim 1, wherein the non-display area extends in the first direction along both sides of the front surface opposite to each other in a second direction crossing the first direction, both sides of the one side surface opposite to each other in the second direction, and both sides of the rear surface opposite to each other in the second direction.

3. The display apparatus of claim 1, wherein the non-display area extends in a second direction crossing the first direction in another portion of the display panel except for a portion of the display panel overlapping the front surface.

4. The display apparatus of claim 1, wherein the display panel is disposed on the other side surface to surround the first support, and
wherein the window further comprises a second side surface part disposed on the other side surface and surrounding the display panel with the front surface part, the first side surface part, and the rear surface part.

5. The display apparatus of claim 4, wherein the front surface part comprises:
first short sides extending in the first direction to face each other in a second direction crossing the first direction;
first long sides extending in the second direction to face each other in the first direction; and
first rounded portions respectively extending from both sides of the first long sides and respectively connected to both sides of the first short sides disposed adjacent to the first long sides,
wherein side surface parts defined as the first side surface part and the second side surface part respectively extend from the first long sides and are bent in a third direction crossing a plane parallel to the first and second directions, and
wherein the rear surface part is bent and extends continuously from the first side surface parts to face the front surface part.

6. The display apparatus of claim 5, wherein a first length defined as a length of the side surface parts in the second direction is less than a second length defined as a length between the first short sides in the second direction.

7. The display apparatus of claim 6, wherein a third length defined as a length between the first long sides in the first direction is greater than a fourth length defined as a length of each of the first short sides in the first direction and less than the first length.

8. The display apparatus of claim 5, wherein each of the first rounded portions has a convexly curved quarter-circular shape.

9. The display apparatus of claim 5, wherein the rear surface part has the same shape as the front surface part and is bent from one of the side surface parts in the first direction to overlap the front surface part.

10. The display apparatus of claim 9, wherein the rear surface part comprises:
second short sides extending in the first direction to face each other in the second direction;

second long sides extending in the second direction to face each other in the first direction; and second rounded portions respectively extending from both sides of each of the second long sides and respectively connected to both sides of each of the second short sides disposed adjacent to the second long sides, wherein each of the second rounded portions has a convexly curved quarter-circular shape.

11. The display apparatus of claim 10, wherein the display panel has a rectangular shape having long sides extending in the first direction and short sides extending in the second direction.

12. The display apparatus of claim 5, wherein the front surface part further comprises:

a front display area disposed up to the first long sides, having a length less than that of each of the first long sides in the second direction, and disposed between first boundary lines defined as lines each of which connects both sides of each of the first long sides parallel to face each other in the first direction; and front non-display areas disposed with the front display area therebetween in the second direction.

13. The display apparatus of claim 12, wherein the first side surface part extends from one first long side of the first long sides, and wherein the second side surface part extends from the other first long side of the first long sides.

14. The display apparatus of claim 13, wherein the first side surface part comprises:

a first side display area extending from the front display area; and a first side non-display area extending from the front non-display areas and disposed around the first side display area.

15. The display apparatus of claim 14, wherein the second side surface part comprises:

a second side display area extending from the front display area; and second side non-display areas extending from the front non-display areas, wherein the second side non-display areas are disposed with the second side display area therebetween in the second direction, and the second side display area is disposed up to two boundary lines of the second side surface part in the first direction.

16. The display apparatus of claim 15, wherein the rear surface part further comprises:

a rear display area extending from the second side display area; and a rear non-display area extending from the second side non-display areas and disposed around the rear display area.

17. The display apparatus of claim 16, wherein the display area overlaps the front display area, the first side display area, the second side display area, and the rear display area.

18. The display apparatus of claim 5, further comprising:

a second support disposed on the first support in the second direction; and a third support disposed under the first support in the second direction, wherein the second support and the third support have shapes symmetrical to each other in the second direction, the second support has a lower portion length greater than an upper portion length thereof, the third support has an upper portion length greater than a lower portion length thereof, and each of both side surfaces of the second support in the first direction and both side surfaces of the third support in the first direction has a convexly curved quarter-circular shape.

19. The display apparatus of claim 18, wherein the front surface part is disposed on the front surface of the first support, a front surface of the second support, and a front surface of the third support, the side surface parts are disposed on the side surfaces of the first support, the rear surface part is disposed under the rear surface of the first support, a rear surface of the second support, and a rear surface of the third support, and the display panel is disposed between the window and the first support.

20. The display apparatus of claim 18, further comprising brackets disposed to cover a top surface of the second support, a bottom surface of the third support, both side surfaces of the second support, and the both side surfaces of the third support.

21. The display apparatus of claim 1, wherein each of the display panel and the window has flexibility, and the front surface part, the first side surface part, and the rear surface part are integrated with each other.

\* \* \* \* \*